US008713483B2

(12) United States Patent
Tritchkov et al.

(10) Patent No.: US 8,713,483 B2
(45) Date of Patent: Apr. 29, 2014

(54) IC LAYOUT PARSING FOR MULTIPLE MASKS

(75) Inventors: Alexander Tritchkov, Hillsboro, OR (US); Emile Y. Sahouria, Sunnyvale, CA (US); Le Hong, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 905 days.

(21) Appl. No.: 11/758,510

(22) Filed: Jun. 5, 2007

(65) Prior Publication Data

US 2008/0307381 A1  Dec. 11, 2008

(51) Int. Cl.
*G06F 17/50* (2006.01)

(52) U.S. Cl.
USPC .................... 716/50; 716/51; 716/52; 716/55

(58) Field of Classification Search
USPC ....................................................... 716/50–56
See application file for complete search history.

(56) References Cited

U.S. PATENT DOCUMENTS

| | | |
|---|---|---|
| 4,532,650 A | 7/1985 | Wihl et al. |
| 4,762,396 A | 8/1988 | Dumant et al. |
| 5,396,584 A | 3/1995 | Lee et al. |
| 5,502,654 A | 3/1996 | Sawahata |
| 5,655,110 A | 8/1997 | Krivokapic et al. |
| 5,723,233 A | 3/1998 | Garza et al. |
| 5,815,685 A | 9/1998 | Kamon |
| 5,825,647 A | 10/1998 | Tsudaka |
| 5,879,844 A | 3/1999 | Yamamoto et al. |
| 5,991,006 A | 11/1999 | Tsudaka |
| 6,016,357 A | 1/2000 | Neary et al. |
| 6,033,814 A | 3/2000 | Burdorf et al. |
| 6,042,257 A | 3/2000 | Tsudaka |
| 6,049,660 A | 4/2000 | Ahn et al. |
| 6,077,310 A | 6/2000 | Yamamoto et al. |
| 6,080,527 A | 6/2000 | Huang et al. |
| 6,120,952 A | 9/2000 | Pierrat et al. |

(Continued)

FOREIGN PATENT DOCUMENTS

| | | |
|---|---|---|
| JP | 09319067 | 12/1997 |
| JP | 11-102380 | 4/1999 |

(Continued)

OTHER PUBLICATIONS

Adam et al., "Improved Modeling Performance with an Adapted Vectorial Formulation of the Hopkins imaging Equation," *Proceedings of SPIE: Optical Microlithography XVI*, vol. 5040, pp. 78-91 (Feb. 25, 2003).

(Continued)

*Primary Examiner* — Paul Dinh
(74) *Attorney, Agent, or Firm* — Mentor Graphics Corporation

(57) ABSTRACT

A method for separating features in a target layout into different mask layouts for use in a photolithographic process. Features of a target layer are searched for features having a predefined shape. In one embodiment, portions of the feature having the predefined shape divided into two or more sub-features and at least one sub-feature are not considered when separating the features into two or more mask layouts. In another embodiment, features having a predefined shape are cut to form two or more sub-features and all features and sub-features are considered when separating the features of the target layout into the two or more mask layouts.

19 Claims, 19 Drawing Sheets

(56) References Cited

U.S. PATENT DOCUMENTS

| | | | |
|---|---|---|---|
| 6,128,067 A | 10/2000 | Hashimoto | |
| 6,187,483 B1 | 2/2001 | Capodieci et al. | |
| 6,243,855 B1 | 6/2001 | Kobayashi et al. | |
| 6,249,904 B1 | 6/2001 | Cobb | |
| 6,263,299 B1 | 7/2001 | Aleshin et al. | |
| 6,269,472 B1 | 7/2001 | Garza et al. | |
| 6,285,783 B1 | 9/2001 | Isomura et al. | |
| 6,301,697 B1 | 10/2001 | Cobb | |
| 6,370,679 B1 | 4/2002 | Chang et al. | |
| 6,415,421 B2 | 7/2002 | Anderson et al. | |
| 6,425,113 B1 | 7/2002 | Anderson et al. | |
| 6,425,117 B1 | 7/2002 | Pasch et al. | |
| 6,430,737 B1 | 8/2002 | Cobb et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,499,003 B2 | 12/2002 | Jones et al. | |
| 6,503,666 B1 | 1/2003 | Pierrat | |
| 6,516,459 B1 | 2/2003 | Sahouria | |
| 6,553,562 B2 | 4/2003 | Capodieci et al. | |
| 6,574,784 B1 | 6/2003 | Lippincott et al. | |
| 6,584,610 B1 | 6/2003 | Wu et al. | |
| 6,620,561 B2 | 9/2003 | Winder et al. | |
| 6,643,616 B1 | 11/2003 | Granik et al. | |
| 6,649,309 B2 | 11/2003 | Mukherjee | |
| 6,668,367 B2 | 12/2003 | Cobb et al. | |
| 6,681,379 B2 | 1/2004 | Pierrat | |
| 6,748,578 B2 | 6/2004 | Cobb | |
| 6,785,879 B2 | 8/2004 | Pierrat | |
| 6,787,271 B2 | 9/2004 | Cote et al. | |
| 6,792,590 B1 | 9/2004 | Pierrat et al. | |
| 6,811,935 B2 | 11/2004 | Pierrat | |
| 6,817,003 B2 | 11/2004 | Lippincott et al. | |
| 6,857,109 B2 | 2/2005 | Lippincott | |
| 6,861,204 B2 | 3/2005 | Cote et al. | |
| 6,883,158 B1 | 4/2005 | Sandstrom et al. | |
| 6,887,633 B2 | 5/2005 | Tang | |
| 6,901,574 B2 | 5/2005 | LaCour et al. | |
| 6,901,575 B2 | 5/2005 | Wu et al. | |
| 6,928,634 B2 | 8/2005 | Granik et al. | |
| 6,973,633 B2 | 12/2005 | Lippincott et al. | |
| 6,978,436 B2 | 12/2005 | Cote et al. | |
| 7,010,776 B2 | 3/2006 | Gallatin et al. | |
| 7,013,439 B2 | 3/2006 | Robles et al. | |
| 7,017,141 B2 | 3/2006 | Anderson et al. | |
| 7,024,655 B2 | 4/2006 | Cobb | |
| 7,028,284 B2 | 4/2006 | Cobb et al. | |
| 7,028,285 B2 | 4/2006 | Cote et al. | |
| 7,047,516 B2 | 5/2006 | Futatsuya | |
| 7,069,534 B2 | 6/2006 | Sahouria et al. | |
| 7,073,162 B2 | 7/2006 | Cobb et al. | |
| 7,138,212 B2 | 11/2006 | Hsu et al. | |
| 7,155,699 B2 | 12/2006 | Cobb | |
| 7,165,234 B2 | 1/2007 | Pierrat | |
| 7,181,721 B2 | 2/2007 | Lippincott et al. | |
| 7,216,331 B2 | 5/2007 | Wu et al. | |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,281,226 B2 | 10/2007 | Wu et al. | |
| 7,281,234 B2 | 10/2007 | Lippincott | |
| 7,293,249 B2 | 11/2007 | Robles et al. | |
| 7,312,003 B2 | 12/2007 | Cote et al. | |
| 7,324,930 B2 | 1/2008 | Cobb | |
| 7,348,108 B2 | 3/2008 | Cote et al. | |
| 7,367,009 B2 | 4/2008 | Cobb et al. | |
| 7,435,513 B2 | 10/2008 | Cote et al. | |
| 7,458,059 B2 | 11/2008 | Stirniman et al. | |
| 7,500,217 B2 | 3/2009 | Cote et al. | |
| 7,673,277 B2 * | 3/2010 | Tang | 716/50 |
| 2004/0005089 A1 | 1/2004 | Robles et al. | |
| 2004/0142251 A1 | 7/2004 | Hsu et al. | |
| 2005/0149901 A1 | 7/2005 | Tang | |
| 2005/0251771 A1 | 11/2005 | Robles | |
| 2005/0278686 A1 | 12/2005 | Word et al. | |
| 2006/0188796 A1 | 8/2006 | Word | |
| 2006/0199084 A1 | 9/2006 | Word | |
| 2006/0200790 A1 | 9/2006 | Shang et al. | |
| 2006/0240342 A1 | 10/2006 | Tang | |
| 2006/0277521 A1 | 12/2006 | Chen et al. | |
| 2006/0288325 A1 * | 12/2006 | Miyamoto et al. | 716/19 |
| 2007/0074143 A1 | 3/2007 | Cobb et al. | |
| 2007/0118826 A1 | 5/2007 | Lippincott | |
| 2007/0124708 A1 | 5/2007 | Robles et al. | |
| 2007/0245291 A1 | 10/2007 | Wu et al. | |
| 2008/0020296 A1 | 1/2008 | Hsu et al. | |
| 2008/0076042 A1 | 3/2008 | Cote et al. | |
| 2008/0141195 A1 | 6/2008 | Robles et al. | |
| 2008/0148217 A1 | 6/2008 | Park | |
| 2008/0166639 A1 | 7/2008 | Park et al. | |
| 2009/0125867 A1 | 5/2009 | Cote et al. | |
| 2010/0050149 A1 | 2/2010 | Cote et al. | |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/65315 | 7/2001 |
| WO | WO 01/97096 | 12/2001 |
| WO | WO/02/03140 | 1/2002 |
| WO | WO/02/101468 | 12/2002 |

OTHER PUBLICATIONS

Bailey et al., "Double pattern EDA solutions for 32nm HP and beyond," *Proc. SPIE*, vol. 6521, pp. 65211K-1 through 65211K-12 (2007).

Bailey et al., "Intensive 2D SEM Model Calibration for 45nm and Beyond," *Proceedings of SPIE*, vol. 6154, 10 pp. (Feb. 21, 2006).

Brist et al., "Effective Multicutline QUASAR Illumination Optimization for SRAM and Logic," *Proceedings of SPIE: Design and Process Integration for Microelectronic Manufacturing*, vol. 5042, pp. 153-159 (Feb. 27, 2003).

Brist et al., "Illumination Optimization Effects on OPC and MDP," *Proceedings of SPIE*, vol. 5754, pp. 1179-1189 (Mar. 1, 2005).

Brist et al., "Source Polarization and OPC Effects on Illumination Optimization," *Proceedings of SPIE, 25th Annual BACUS Symposium on Photomask Technology*, vol. 5992, pp. 599232-1/9 (Oct. 3, 2005).

Chen et al., "RET Masks for the Final Frontier of Optical Lithography," *Proceedings of SPIE: Photomask and Next-Generation Lithography Mask Technology XII*, vol. 5853, pp. 168-179 (Apr. 13, 2005).

Cobb et al., "Experimental Results on Optical Proximity Correction With Variable Threshold Resist Model," *Proceedings of SPIE: Symposium on Optical Microlithography X*, vol. 3051, pp. 458-468 (Mar. 10-14, 1997).

Cobb et al., "Fast, Low-Complexity Mask Design," *Proceedings of SPIE: Symposium on Optical/Laser Microlithography VIII*, vol. 2440, pp. 313-327 (Feb. 22-24, 1995).

Cobb et al., "Fast Sparse Aerial Image Calculation for OPC," *Proceedings of SPIE: 15th Annual BACUS Symposium on Photomask Technology and Management*, vol. 2621, pp. 534-545 (Sep. 20-22, 1995).

Cobb, "Flexible Sparse and Dense OPC Algorithms," *Proceedings of SPIE, Photomask and Next-Generation Lithography Mask Technology XII*, vol. 5853, pp. 693-702 (Apr. 13, 2005).

Cobb et al., "Large Area Phase-Shift Mask Design," *Proceedings of SPIE, Symposium on Optical/Laser Microlithography VII*, vol. 2197, pp. 348-360 (Mar. 2-4, 1994).

Cobb et al., "Mathematical and CAD Framework for Proximity Correction," *Proceedings of SPIE: Symposium on Optical Microlithography IX*, vol. 2726, pp. 208-222 (Mar. 13-15, 1996).

Cobb et al., "Model-Based OPC Using the MEEF Matrix," *Proceedings of SPIE, 22nd Annual BACUS Symposium on Photomask Technology*, vol. 4889, 10 pp. (Sep. 30-Oct. 4, 2002).

Cobb et al., "New Concepts in OPC," *Proceedings of SPIE: Optical Microlithography XVII*, vol. 5377, pp. 680-690 (Feb. 24, 2004).

(56) References Cited

OTHER PUBLICATIONS

Cobb et al., "OPC Methods to Improve Image Slope and Process Window," *Proceedings of SPIE: Design and Process Integration for Microelectronic Manufacturing*, vol. 5042, pp. 116-125 (Feb. 27, 2003).

Cobb et al., "Using OPC to Optimize for Image Slope and Improve Process Window," *Proceeding of SPIE, Photomask Japan*, vol. 5130, pp. 838-846 (Apr. 16-18, 2003).

Granik, "Generalized Meef Theory," *Interface 2001*, 13 pp. (Nov. 2001).

Granik et al., "Meef as a Matrix," *Proceedings of SPIE: 21st Annual BACUS Symposium on Photomask Technology*, vol. 4562, pp. 980-991 (Oct. 2-5, 2001).

Granik, "New Process Models for OPC at sub-90nm Nodes," *Proceedings of SPIE: Optical Microlithography XVI*, vol. 5040, pp. 1166-1175 (Feb. 25, 2003).

Granik, "Solving Inverse Problems of Optical Microlithography," *Proceedings of SPIE: Optical Microlithography XVIII*, vol. 5754, pp. 506-526 (Mar. 1, 2005).

Granik et al., "Two-Dimensional G-MEEF Theory and Applications," *Proceedings of SPIE: Symposium on Photomask and Next-Generation Lithography Mask Technology IX*, vol. 4754, pp. 146-155 (Apr. 23-25, 2002).

Granik et al., "Universal process modeling with VTRE for OPC," *Proceedings of SPIE: Optical Microlithography XV*, vol. 4691, pp. 377-394 (Mar. 5, 2002).

Hong et al., "Impact of Process Variance on 65 nm Across-Chip Linewidth Variation," *Proceedings of SPIE: Design and Process Integration for Microelectronic Manufacturing IV*, vol. 6156, pp. 61560Q1-9 (Feb. 23, 2006).

Liebmann, "Layout Methodology Impact of Resolution Enhancement Technique," *Electronic Design Process*, 7 pp. (2003).

Lucas et al., "Reticle Enhancement Verification for 65 nm and 45 nm Nodes," *Proceedings of SPIE: Design and Process Integration for Microelectronic Manufacturing IV*, vol. 6156, pp. 61560Q1-9 (Feb. 23, 2006).

Maenhoudt et al., "Double Patterning Scheme for Sub-0.25 k1 Single Damascene Structures," *Proceedings of SPIE: Optical Microlithography XVIII*, vol. 5754, pp. 1508-1518 (Mar. 1, 2005).

Maurer et al., "Evaluation of a Fast and Flexible OPC Package: OPTISSIMO," *Proceedings of SPIE: 16th Annual Symposium on Photomask Technology and Management*, vol. 2884, pp. 412-418 (Sep. 18-20, 1996).

Maurer et al., "Process Proximity Correction Using an Automated Software Tool," *Proceedings of SPIE: Optical Microlithography XI*, vol. 3334, pp. 245-253 (Feb. 22-27. 1998).

Mentor Graphics Corporation, News and Views, "DSM Verification and Analysis," including a partial translation, 7 pp. (document marked Mar. 1999).

Mentor Graphics Corporation, News and Views, "OPC," including a partial translation, 11 pp. (document marked Mar. 1999).

Mentor Graphics Corporation, News and Views, "Calibre," including a partial translation, 9 pp. (document marked Apr. 2000).

Ohnuma et al., "Lithography Computer Aided Design Technology for Embedded Memory in Logic," *Japanese Journal of Applied Physics*, vol. 37(12B), pp. 6686-6688 (Dec. 1998).

Op de Beeck et al., "Manufacturability issues with double patterning for 50-nm half-pitch single damascene applications using Relacs shrink and corresponding OPC," *Proc. SPIE*, vol. 6520, pp. 65200I-1 through 65200I-13 (2007).

Park et al., "Application Challenges with Double Patterning Technology Beyond 45 nm," *Proceedings of SPIE: Photomask Technology 2006*, vol. 6349, pp. 634922-1 through 634922-12 (Sep. 19, 2006).

Schellenberg, "Sub-Wavelength Lithography Using OPC," *Semiconductor Fabtech*, 9th ed., pp. 205-209 (Mar. 1999).

Torres et al., "Design Verification Flow for Model-Assisted Double Dipole Decomposition," *Proceedings of SPIE: Optical Microlithography XV*, vol. 4691, pp. 585-592 (Mar. 5, 2002).

Torres et al., "Model Assisted Double Dipole Decomposition," *Proceedings of SPIE: Optical Microlithography XV*, vol. 4691, pp. 407-417 (Mar. 5, 2002).

Torres et al. "RET-Compliant Cell Generation for Sub-130 nm Processes," *Proceedings of SPIE: Optical Microlithography XV*, vol. 4691, pp. 529-539 (Mar. 5, 2002).

Wiaux et al., "193 nm Immersion Lithography Towards 32 nm hp Using Double Patterning," *3rd International Symposium on Immersion Lithography*, 23 pp. (Oct. 2-5, 2006).

Word et al. "Advanced Layout Fragmentation and Simulation Schemes for Model Based OPC," *Proceedings of SPIE: Optical Microlithography XVIII*, vol. 5754, pp. 1159-1168 (Mar. 1, 2005).

Park et al., "Robust Double Exposure Flow for Memory," 11 pp. (also published as Park et al., "Robust Double Exposure Flow for Memory," *Proc. SPIE: Optical Microlithography XIX*, vol. 6154, pp. 808-817 (Feb. 19, 2006)).

\* cited by examiner

IC LAYOUT PARSING FOR MULTIPLE MASKS

FIELD

The disclosed technology relates to data preparation for preparing masks for photolithographic processing, and in particular to masks to be used in double patterning photolithographic techniques.

BACKGROUND

In conventional lithographic processing, integrated circuits are created by exposing a pattern of features contained on a mask or reticle onto a wafer that is coated with light sensitive materials. After exposure, the wafer is then chemically and mechanically processed to create the circuit elements corresponding to the features on the wafer. The process is then repeated for the next layer of the integrated circuit in order to build up the circuit on a layer by layer basis.

The ability of a photolithographic imaging system to accurately print a desired pattern of features on a wafer is diminished as the size and/or spacing of the features becomes smaller and smaller. Optical and other process distortions occur such that the way in which small or very closely spaced features are printed on the wafer may vary substantially from a desired target pattern. To compensate for these distortions, numerous resolution enhancement techniques (RETs) such as optical and process correction (OPC), sub-resolution assist features (SRAFs), phase shifting masks (PSMs) and others have been developed that increase the fidelity with which a target pattern of features can be printed on a wafer.

One technique that can also be used to print small and/or densely packed features is called double patterning. With double patterning, a target pattern of features to be printed on a wafer is divided among two or more masks. Each mask generally prints every other feature of the target pattern on the wafer. The features of the second mask are positioned to be printed in the spaces that are between the features printed by the first mask. Because the features on each mask are spaced farther apart, they are not distorted as much during the printing process.

Double patterning techniques are one of many multiple mask processing approaches that assemble the final pattern using multiple exposures. As commonly used, the term "double exposure" refers to the use of two photomasks to expose the same photoresist, which is then processed only after all exposures are made. Some applied phase-shifting mask techniques well known in the art use double exposure, in which certain high resolution features are provided by one mask, while other lower resolution features are provided by another mask. The separation of layouts for use with double-dipole lithography, in which layouts are parsed into horizontally and vertically oriented portions for exposure with vertical and horizontally oriented dipole illumination, respectively, is another example of a double exposure technique.

In what is commonly called "double patterning", the layout is again parsed between two photomasks, but the process is usually designed such that, after the initial exposure with one mask, the wafer is processed and the patterns fixed, typically using an intermediate hard mask on the wafer. The wafer is then recoated with photoresist for exposure to the second photomask, followed with a second sequence of processing steps to produce the final pattern. Since the initial layout is processed and preserved for later use in the second patterning step, there is more flexibility in the layout parsing rules and processing conditions under which double patterning can be carried out.

Despite the benefits that may be obtained with the double patterning process, the technique can be difficult to implement with real world lithographic designs. In particular, it can be difficult and time consuming to separate a target pattern of features into two or more mask layouts in a way that ensures that each mask does not have features that are spaced within a predetermined distance of each other. Therefore, there is a need for a more efficient technique for preparing mask layouts for use with a double patterning photolithographic process.

SUMMARY

The disclosed technology relates to a method of preparing layout data for use with a double patterning photolithographic process. A computer system receives data representing a target layout of features to be printed on a wafer. The data is analyzed to identify features that have one or more predetermined shapes. Features having one of the predetermined shapes are broken or cut into smaller sub-features. In one embodiment, a coloring algorithm analyzes the data representing the features of the target layout in order to divide the features among two or more mask layouts while not considering or isolating some of the sub-features. In another embodiment, a gap is introduced between the sub-features and all the features and sub-features are analyzed to divide the features of the target layout among two or more mask layouts.

DETAILED DESCRIPTION

Figure 1:
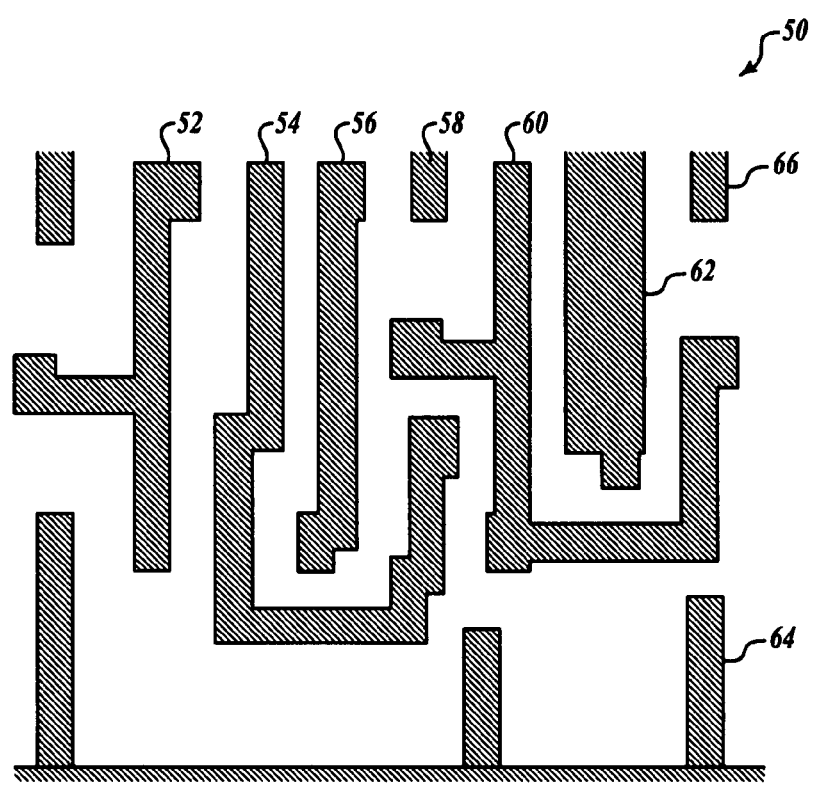
FIG. 1 illustrates a sample target layout pattern to be printed on a wafer with a double patterning photolithographic process.

FIG. 1 illustrates an example of a target layout pattern of features 50 to be created on a wafer with a double patterning photolithographic process. The target layout pattern includes a number of features 52-66 that are to be printed on the wafer. Typically, the features in the target layout pattern are defined as polygons in a layout description language, such as GDS-II or OASIS, and are stored in a layout database. Some of the polygons in the layout database represent circuit elements to be created on the wafer, while others may represent non-printing features such as sub-resolution assist features (SRAFs).

If the spacing between features in the target layout is sufficiently small, optical distortions can occur when the features are printed such that the shape of the features that are printed on a wafer may vary significantly from their shape defined in the target layout pattern.

As indicated above, one approach to improving the fidelity of a printed pattern of features is to use a double patterning process, whereby the target pattern of features is printed with two or more masks. Each mask prints some of the features of the target pattern. However, the masks are created such that the space between each feature on a single mask is large enough such that the features will print without significant distortion.

Figure 2:
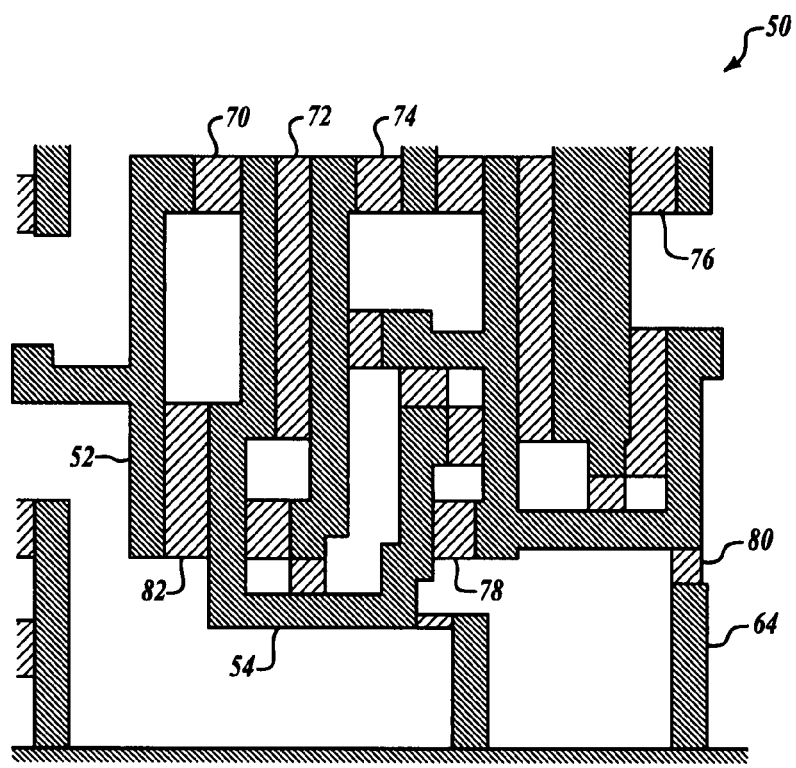
FIG. 2 illustrates a number of features defining a decomposition space in accordance with one embodiment of the disclosed technology.

FIG. 2 illustrates one technique for separating the features of a target layout among two or more mask layouts that is described in U.S. patent application Ser. No. 11/621,077, which is assigned to Mentor Graphics Corporation of Wilsonville, Oreg., the assignee of the disclosed technology, and is herein incorporated by reference. In one embodiment of the disclosed technology, a decomposition space is defined by creating new polygons that define features in selected spaces between features of the target layout. In one embodiment, the features of the target layout 50 are analyzed by a computer program such as the Calibre™ program suite available from Mentor Graphics to determine the distance between adjacent features. New polygons 70, 72, 74, 76, 78, 80, etc. are defined in the layout database where the distances between the features of the target layout are less than the lithographic resolution limit of the lithographic process that will be used to print the features. For example, polygons 70 and 82 are defined between the adjacent features 52 and 54 because the distance between the features 52 and 54 is less than the resolution limit of the photolithographic process to be used.

Once the polygons defining the features of the decomposition space have been created, the decomposition space can be used as an input layer to a coloring algorithm. Coloring algorithms, such as those used in PSMGate that is part of the Calibre program suite, are often used in the creation of phase-shifting masks to assign one property (e.g. 0 degrees of phase shift) to features on one side of a feature in the input layer and another property (e.g. 180 degrees of phase shift) to a features on another side of the feature in the input layer. For double patterning decomposition, the property that is assigned to the features on each side of a feature in the input decomposition space layer is the mask layout to which the features will be assigned. For example, the coloring algorithm may assign feature 52 that is adjacent to the polygon 82 in the decomposition space to one mask layout and feature 54 that is on the other side of the polygon 82 to another mask layout.

Figure 3:
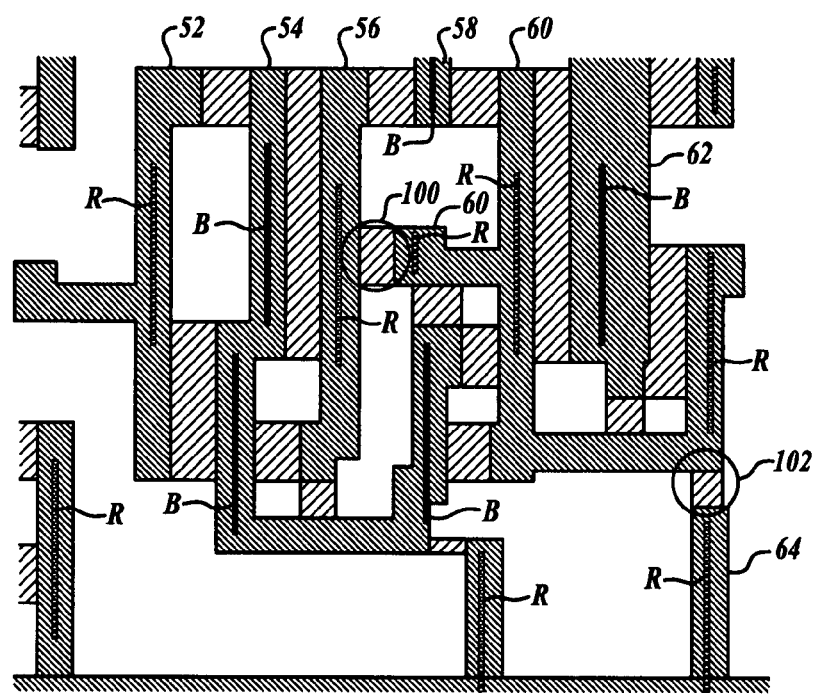
FIG. 3 illustrates a pair of decomposition conflicts in the target layout pattern shown in FIG. 2 that occur as a result of an initial separation of the features between two mask layouts.

For some integrated circuit layouts, it is possible to separate the features of the target layout among two or more mask layouts with a single application of a coloring algorithm. In many instances however, there is no way to assign the features of the target layout to the two or more mask layouts in a manner that ensures that every feature contained in a single mask layout is greater than a predetermined distance away from an adjacent feature. FIG. 3 illustrates the target layout pattern shown in FIG. 2 wherein features 52, 56, 60 and 64 are assigned one value (e.g., red) by the coloring algorithm for inclusion in a first mask layout and features 54, 58 and 62 are assigned another value (e.g., black) by the coloring algorithm for inclusion in a second mask layout. However, decomposition conflicts, as indicated by 100 and 102, occur where the distance between features that are assigned to the same mask layout is less than or equal to the lithographic resolution limit of the photolithographic printing system. To eliminate such conflicts, it is often desirable to break or divide larger features into two or more pieces (i.e., sub-features) such that one or more of the sub-features can be assigned to different mask layouts.

One aspect of the disclosed technology is a method of analyzing a target layout with a computer program to automatically determine those places where a feature may be divided in order to facilitate the assignment of features to two or more mask layouts for use in a double patterning process.

In one embodiment of the disclosed technology, a computer program analyzes a target layout for features having a predetermined shape such as U-shaped, S-shaped or T-shaped features. Once features having one of the predefined shapes are located, the features are divided into two or more sub-features. In one embodiment, selected sub-features are removed from consideration during the application of the coloring algorithm to allow the coloring algorithm to attempt to assign the remaining features of the target layout to the different mask layouts without decomposition conflicts.

In another embodiment, one or more gaps are added between a sub-feature and the feature from which it was divided. All the features, including all the sub-features, can then be analyzed by the coloring algorithm to separate the features among the two or more mask layouts.

Figure 4:
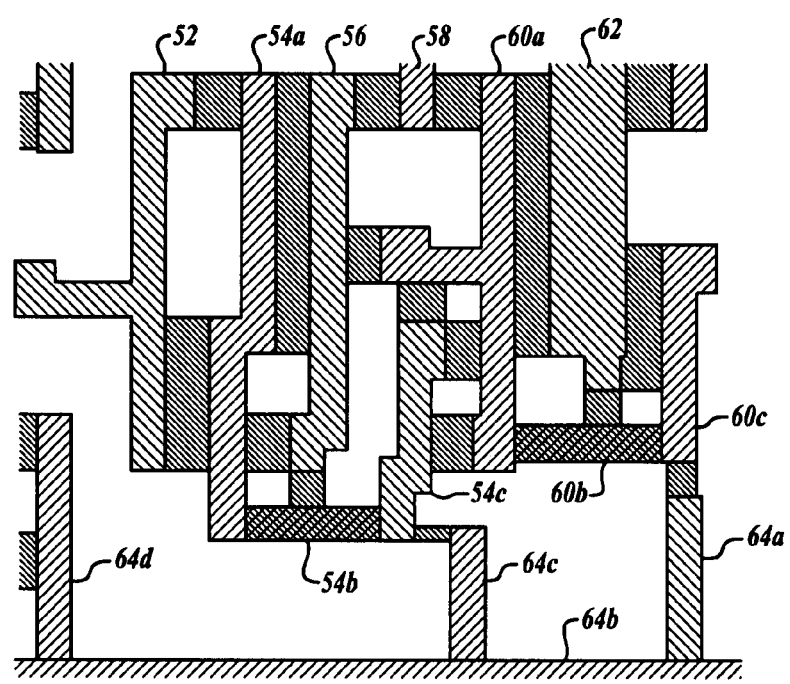
FIG. 4 illustrates isolated sub-features within a target layout pattern in accordance with one embodiment of the disclosed technology.

FIG. 4 illustrates the target layout with some of the features divided into two or more sub-features. For example, feature 54 is shown divided into three sub-features: 54a, 54b and 54c. Similarly, feature 60 is shown divided into three sub-features: 60a, 60b and 60c. Feature 64 is shown cut into four sub-features: 64a, 64b, 64c and 64d. In one embodiment of the disclosed technology, the sub-features 54b and 60b are removed from consideration during the analysis of the target layout by the coloring algorithm. The coloring algorithm is applied to the remainder of the layout and features are assigned to one of two different mask layouts. In the example shown in FIG. 4, features 52, 56 and 62 are assigned to a first mask layout along with sub-features 54c and 64a. Feature 58 and sub-features 54a, 60a, 60c and 64b, 64c and 64d are assigned to the second mask layout.

Comparing the assignment of features in FIG. 4 with the assignment shown in FIG. 3, it will be appreciated that the decomposition conflict 100 is eliminated because the adjacent features 56 and sub-feature 60a are assigned to different mask layouts. Similarly sub-features 60c and 64a are assigned to different mask layouts to eliminate the decomposition conflict 102.

Once the mask layout assignments have been made, the sub-features previously not considered from the target layout during the decomposition analysis are added back to one of the two or more mask layouts. The sub-feature(s) not considered during application of the coloring algorithm are added to the abutting sub-features in a manner that does not cause a decomposition conflict. In the example shown in FIG. 5, the sub-feature 54*b* is re-connected to the sub-feature 54*a* but is divided from the sub-feature 54*c*, which is assigned to the second mask layout. At the cut point between sub-features 54*b* and 54*c*, the polygons that define the sub-features are extended slightly to overlap in an area 110 where they abut to compensate for any misalignment of the multiple masks that may occur during the double patterning process. Similarly, sub-feature 64*a* is cut from sub-feature 64*b* at an area 112. Therefore, the polygons that define these sub-features are extended where the sub-features abut to compensate for any misalignment that may occur.

When two exposures are made using a double patterning process, each photomask is loaded into the lithography equipment and aligned to the wafer using registration marks. Although every effort is taken in commercial lithography equipment to make overlay errors as small as possible, significant misalignments can still occur between the features printed from the first mask and the second mask. Therefore, when final contiguous features must be stitched together from polygons which have been cut, overlay compensation should be used.

Figure 5:
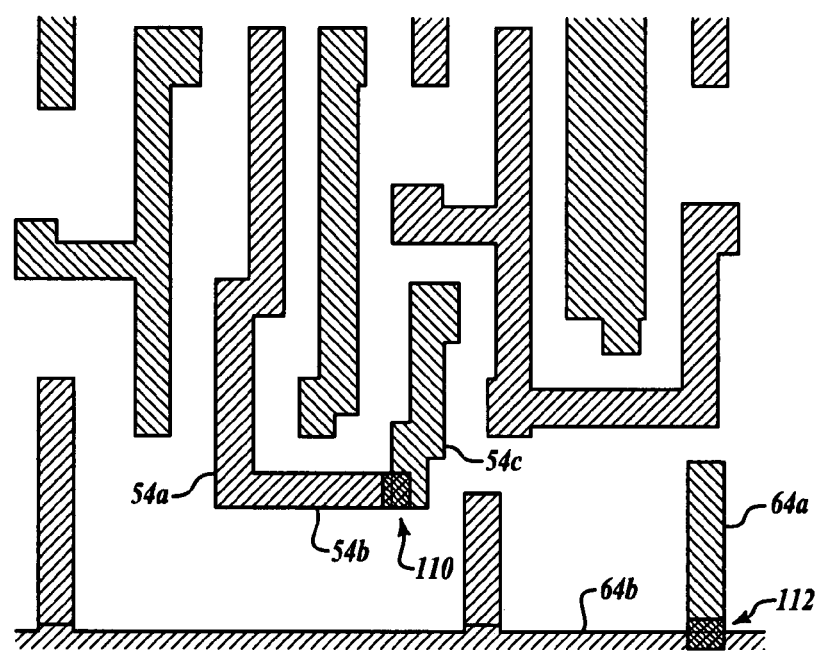
FIG. 5 illustrates biasing sub-features that abut each other but are defined for different mask layouts in accordance with another aspect of the disclosed technology.

FIG. 5 has already illustrated compensation in area 110. In general, Overlay compensation is achieved by the use of selective overlay compensation algorithms. In one embodiment of the disclosed technology, the algorithm is as follows:

1) In the case when the dimension of the portion of the feature in the first mask is equal to the dimension of the corresponding portion in the second mask, then the polygon in the first mask is extended in the direction of the feature in the second mask by some dimension "A", and the polygon in the second mask is extended in the direction of the feature in the first mask by the same amount "A". The mutual extensions in this case are typically in equal amounts, and form an overlap region that insures the final line formed will be contiguous, even in the presence of overlay errors.

2) In the case where the dimension of the portion of the first mask is 2.5 times greater than the dimension of the corresponding portion in the second mask, then the polygon in the first mask is not extended, while the polygon in the second mask is extended in the direction of the feature in the first mask by the amount "2A".

3) In the case where the dimension of the portion of the second mask is 2.5 times greater than the dimension of the corresponding portion in the first mask, then the polygon in the second mask is not extended, while the polygon in the first mask is extended in the direction of the feature in the first mask by the amount "2A".

In another embodiment of the disclosed technology, features are divided into two or more sub-features and all sub-features are considered by the coloring algorithm when dividing the target layout into two or more mask layouts. In one implementation, a gap is introduced in the area where a feature is divided to define a sub-feature. Polygons are added to the decomposition space in the area of the gap. The coloring algorithm recognizes the additional polygons that are part of the decomposition space input layer and therefore analyzes all the features and sub-features in the layout to divide the features among the two or more mask layouts. Once the features are separated among the two or more mask layouts, the areas of the gaps are closed where two adjoining sub-features are defined on the same mask layout. In addition, the polygons that define the sub-features are extended in the area of the gap where adjoining sub-features are defined on different masks layouts.

FIGS. 6A-6D are flow charts of steps performed by a computer system in accordance with one embodiment of the disclosed technology to divide a layout into multiple mask layouts for a double patterning process. Although the steps are shown and described in a particular order, it will be appreciated that the steps may be performed in a different order or different steps performed while still achieving the functionality described.

It should be noted that these flow charts relate to the steps taken to parse the layout data, the subject of this disclosed technology. Once a layout has been parsed into multiple mask layouts, a final step of exporting the layouts for each of the masks must still be accomplished. These final steps are generally accomplished using standard mask data preparation tools, designed to take internal data layers and export them in particular mask writer formats, and are therefore not the focus of this disclosed technology. In one embodiment, the mask layouts for the IC design are stored on a computer readable media and sent to a mask writer that may be inside or outside of the United States.

In one embodiment of the disclosed technology, a computer system such as any electronic circuit that executes programmed instructions receives executable instructions on a computer readable storage media e.g. a CD, DVD, hard disc, flash drive, etc. Alternatively, the instructions may be received over a wired or wireless communication link. The computer system executes the instructions to prepare a target layout of feature data for use with two or more masks for printing with a double patterning process.

Beginning at 200, the computer system receives a drawn layout or portion thereof. At 202, the computer system separates the drawn layout into a target layer in a layout database and a remainder layer in the layout database. In one embodiment of the disclosed technology, the target layer comprises features having sizes that are between predetermined dimensions. Those features that are larger than, or smaller than, the range of dimensions suitable for double patterning defined in the remainder layer.

At 204, polygons that define the decomposition space layer are created in the spaces between those features of the target layer that are smaller than a lithographic resolution limit of the photolithographic system to be used. The photolithographic resolution limit may be user selected or predetermined.

At 206, a coloring algorithm is applied using the features of the decomposition space layer as an input. In one embodiment of the disclosed technology, the coloring algorithm used is the PSM Gate function provided by the Caliber software suite. However, other algorithms that operate to assign adjacent features in a target layer to different mask layouts could be used.

From the coloring algorithm, an initial separation of the features among two or more mask layouts is made. For example, a first mask layout (mask_0), is defined to include one set of features from the target layout identified by the coloring algorithm while a second mask layout (mask_1) contains the other features of the target layout. In one embodiment, the features assigned to each mask layout are defined in separate layers of the layout database.

At 210, it is determined if there are any decomposition conflicts in the two mask layouts mask_0 and mask_1. If so, processing proceeds to the steps shown in FIG. 6C. If not, the processing proceeds to the steps shown in FIG. 6B.

If the initial separation of features in the target layout does not produce any decomposition conflicts, then the features of the remainder layer are added to one of the two mask layouts mask_0 or mask_1. At 220, the features from the remainder layer that touch the features in the mask_0 layout but do not touch the features in the mask_1 layout are added to the features of the mask_0 layout. At 222, the features from the remainder layer that touch the features in the mask_1 layout but do not touch the features in the mask_0 layout are added to the mask_1 layout. At 224, the features from the remainder layer that do not touch either of the features defined in the mask_0 or mask_1 layouts can be added to either the mask_0 or mask_1 layout.

Finally at 226, those features in the remainder layer that touch features in both the mask_0 and mask_1 layouts are analyzed to determine if the feature will be smaller than a minimum mask constraint size if added to either of mask_0 or mask_1 layouts. Masks can only be made with features that are larger than a minimum mask feature size that is governed by a mask writing machine. If a feature is added to a mask that is too small to be manufactured on one of the two masks then it should be included in the other mask layout. Therefore, in one embodiment, the features in the remainder layer that touch features in both of the mask_0 or mask_1 layouts are added to that mask layout in which the added feature size is greater than or equal to the minimum feature size required to be manufactured on the mask. Areas of features that abut but are defined in different mask layouts are extended to compensate for any misalignment or other processing artifact that may cause a discontinuity when the abutting features are printed.

Once all the features from the remainder layer have been added to either of the mask layouts, processing finishes at step 230.

Figure 6A:
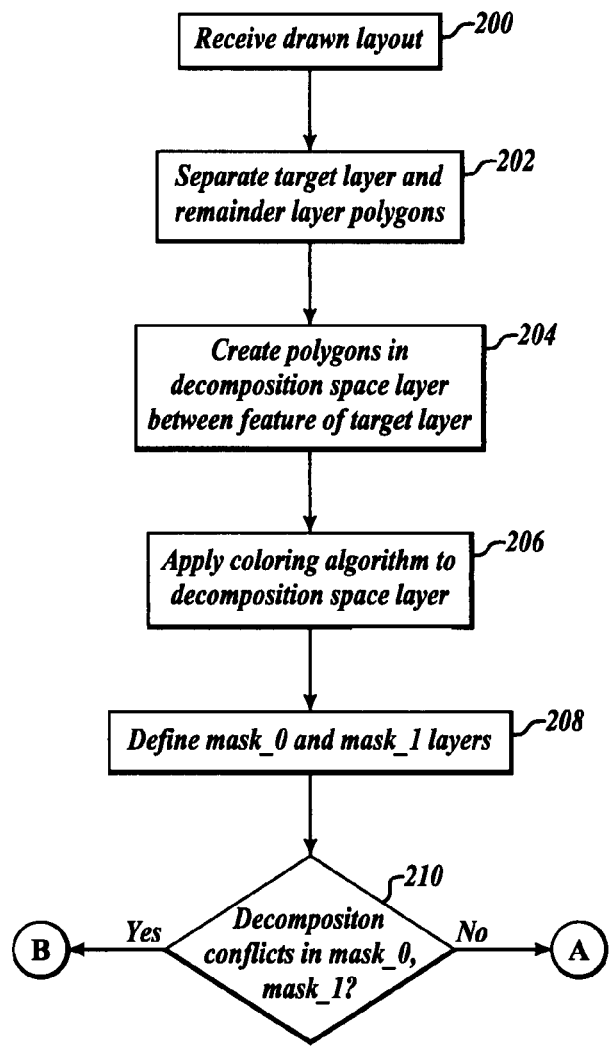
FIGS. 6A-6D are flow charts of steps performed in accordance with one embodiment of the disclosed technology.
Figure 6B:
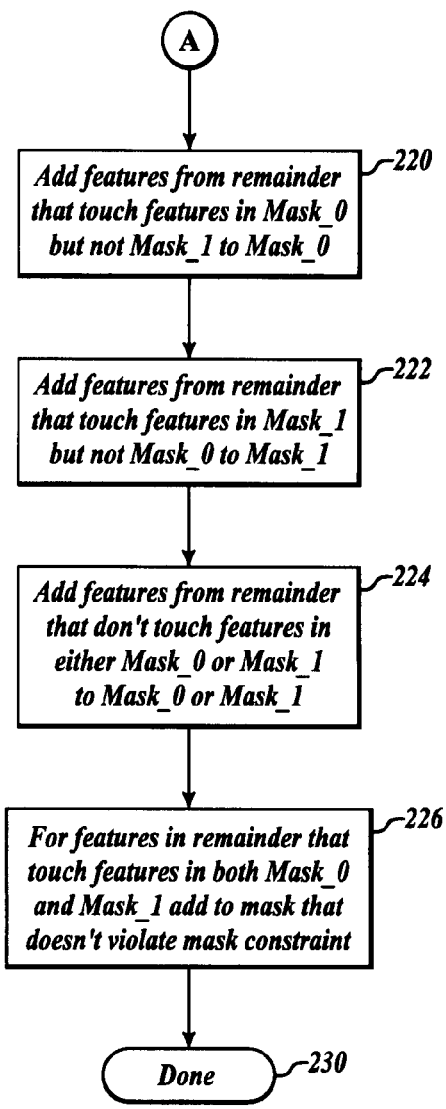
Figure 6C:
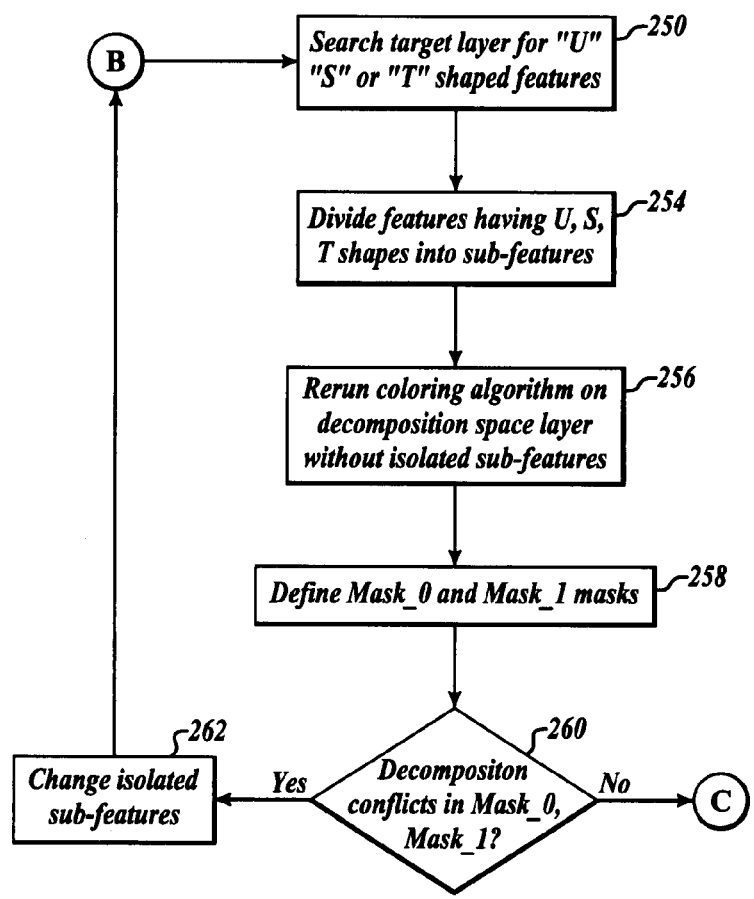

If the answer at step 210 indicates that there are decomposition conflicts in the mask_0 or mask_1 layouts produced from an initial analysis of the target features with the coloring algorithm, then processing proceeds in accordance with the steps shown in FIG. 6C. Beginning with a step 250, one embodiment of the disclosed technology searches the target layout for features having a U, S, or T shape. As will be appreciated by those skilled in the art, these are not the only shapes that may be searched in the target layout. For example, a library of shapes including I-shaped, L-shaped or other shaped features may be included based on user experience if these shapes tend to cause decomposition conflicts.

At 254, features having a U, S, T or other shape are divided into two or more sub-features. In one embodiment of the disclosed technology, the middle sub-feature of a U, S shaped feature or perpendicularly oriented portion of a T-shaped feature is isolated or not considered during application of the coloring algorithm as explained in further detail below.

At 256, the coloring algorithm is reapplied on the decomposition space layer without considering the isolated sub-features. The coloring algorithm produces an initial separation of the features into the mask_0 and mask_1 mask layouts at 258.

At 260, the computer system determines if there are one or more decomposition conflicts in the mask_0 or mask_1 layouts. If so, another analysis of the target layout is performed to modify the sub-features that are isolated at 262. For example, features may be divided into additional sub-features or the sub-features may be defined differently and the process of analyzing the layout with a coloring algorithm repeats. For example, a knowledge base may be defined with features that have previously been found to produce decomposition conflicts in certain situations. The target layout can be searched for features having such shapes before reanalyzing the layout with the coloring algorithm.

Figure 6D:
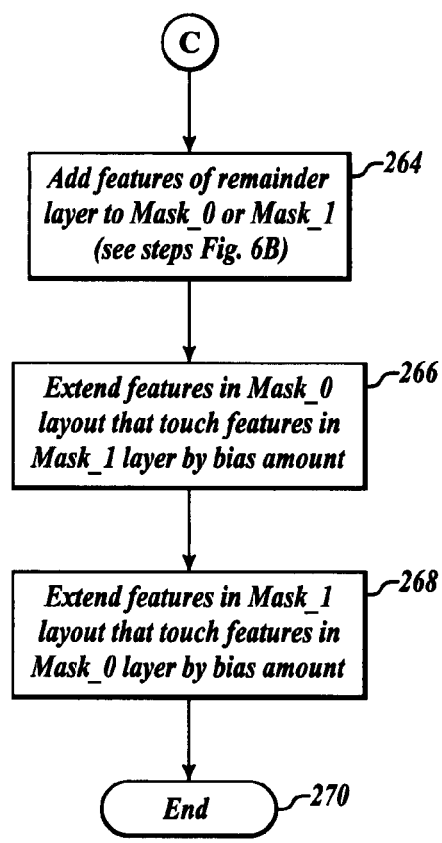

If there are no decomposition conflicts in the mask_0 and mask_1 layouts, processing proceeds to the steps shown in FIG. 6D.

Once it is determined that there are no decomposition conflicts in the mask_0 or mask_1 layouts, the features of the remainder layer are added to the mask_0 or mask_1 layout at 264 in the manner defined in steps 220-226 shown in FIG. 6B.

At 266, the features in the mask_0 layout that abut features defined in the mask_1 layout are extended by a bias amount to overlap in the area of the abutment. As indicated above, the bias amount ensures that there will be overlap in the adjoining portions of the features despite potential misalignment or other processing artifacts during the photolithographic printing process.

At 268, those features that are assigned to the mask_1 layout and abut a feature that is defined in the mask_0 layout are extended by a bias amount to overlap in the area of the abutment. The process ends at 270.

Upon final determination of the features that are to be assigned to the mask_0 and mask_1 layouts, the data defined for each mask layout can be transmitted to a mask writer that fabricates the masks for use in a double-patterning photolithographic process.

Figure 7:
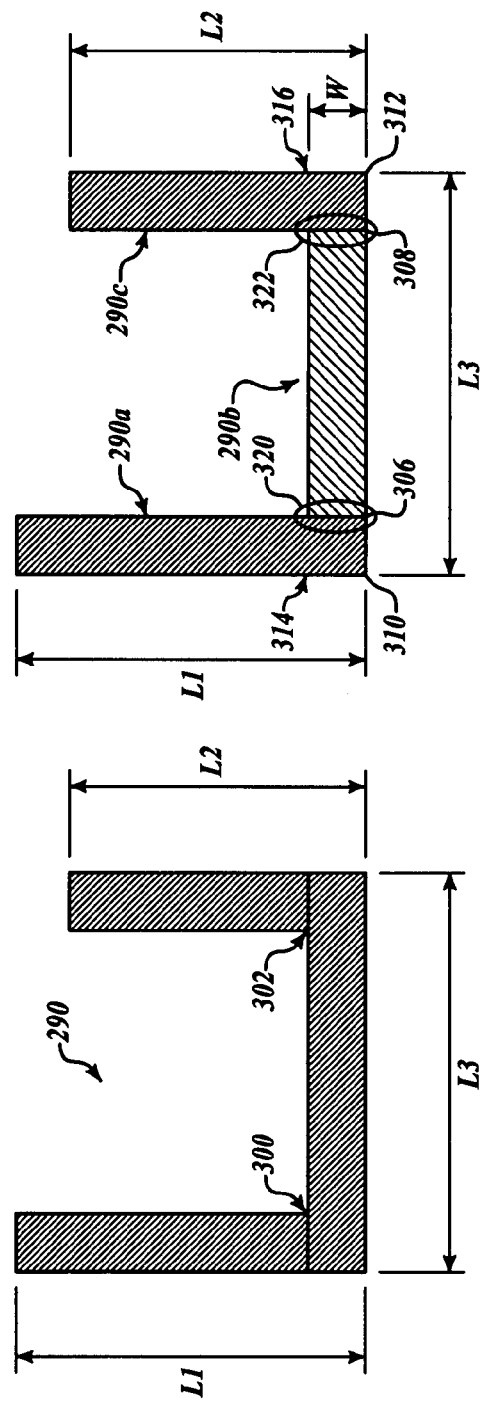
FIG. 7 illustrates how a U-shaped feature can be detected and divided into a number of sub-features in accordance with the one embodiment of the disclosed technology.

FIG. 7 indicates one embodiment of a technique for detecting and dividing U-shaped features into two or more sub-features. In one embodiment of the disclosed technology, U-shaped features are detected by analyzing each feature in the target layer for features having three consecutive segments of length greater than zero that are joined by two concave 90 degree corners. The U-shaped feature 290 is divided into three sub-features 290a, 290b, 290c by defining end points for the middle portion of the sub-feature. In one embodiment the computer uses predefined end points for each feature found that matches the desired feature shape. For example, the computer may define end points at the concave corners (points 300, 302) and opposite from the corners and at the same width as the width of the middle portion of the feature (points 306, 308). Alternatively, the middle sub-feature could be defined by points 310, 312 and points 314, 316. As indicated above, the middle sub-feature 290b may be ignored by the coloring algorithm when separating the feature into two or more mask layouts. In an alternative embodiment, the computer system adds a gap in the feature by defining end points in the feature at one or more of the locations 320, 322 and polygons added in the area of the gap(s) such that the coloring algorithm can consider the sub-feature 290b when attempting to separate the features.

Figure 8:
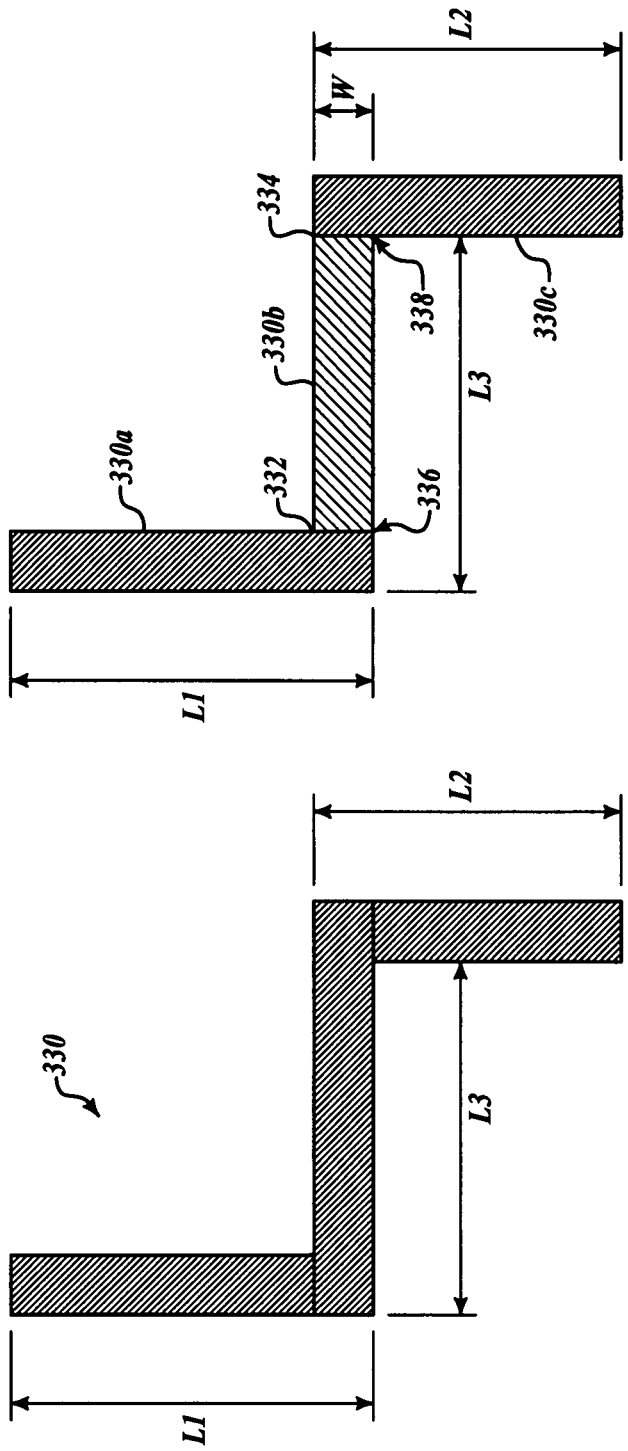
FIG. 8 illustrates how an S-shaped feature can be detected and divided into a number of sub-features in accordance with an embodiment of the disclosed technology.

FIG. 8 illustrates one technique for finding S-shaped features in the target layout. An S shaped feature 330 is detected by the computer by locating features having three consecutive segments of lengths L-1, L-2 and L-3 that are greater than zero and are joined by one concave and one convex corner. In one embodiment of the disclosed technology, the middle sub-feature is divided from the feature by adding end points at predetermined locations such as at the corners 332, 338 and opposite each of the concave and convex corners at points 336, 334 with a width equal to the width of the middle segment. Alternatively, a gap can be introduced by the computer between the sub-feature 330b and its adjoining sub-features 330a and 330b that is filled with a polygon that is included in the decomposition space.

Figure 9:
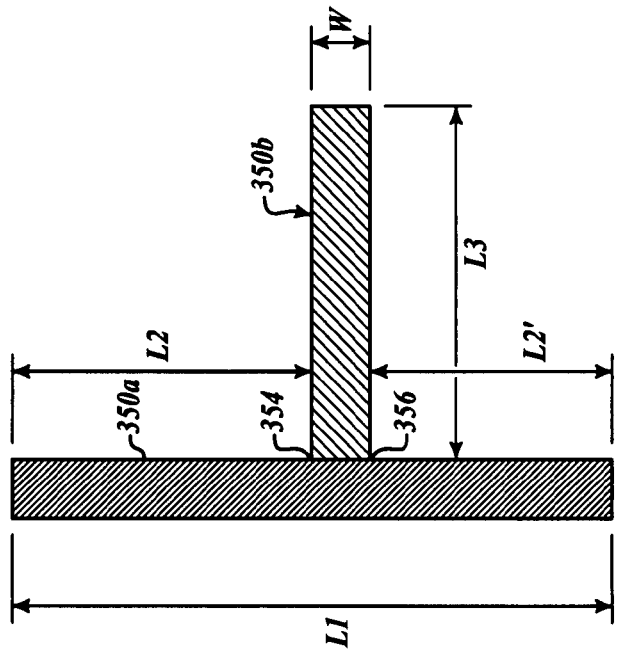
FIG. 9 illustrates how a T-shaped feature can be detected and divided into a number of sub-features in accordance with an embodiment of the disclosed technology.
Figure 9:
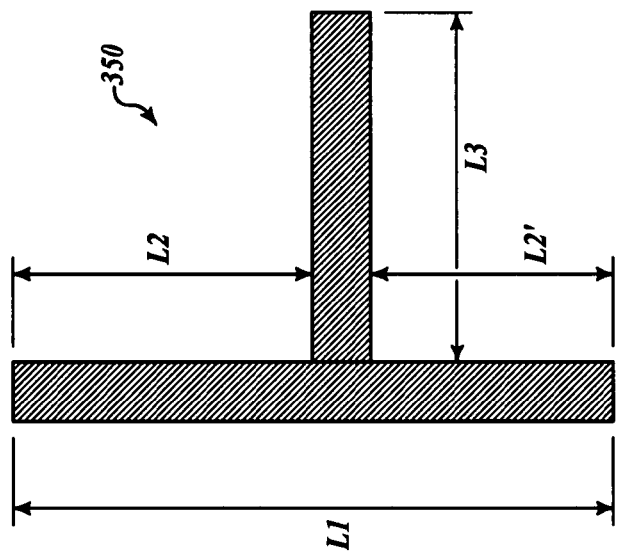

FIG. 9 illustrates one technique for detecting and dividing T-shaped features 350 into two or more sub-features 350a, 350b. To detect a T-shaped feature 350, a search is made for a feature having a segment with a length L-3 that abuts another segment of length L-1 at ninety degrees somewhere along its length as defined by distances L-2 and L-2' that are not equal to zero. The sub-feature 350b is defined by joining the end points at the corners 354, 356. Either of the sub-features 350a, 350b can be ignored during application of the coloring algorithm. Alternatively, a gap can be introduced between the sub-features 350, 352 that is filled by a polygon defined for the decomposition space input layer.

Figure 10:
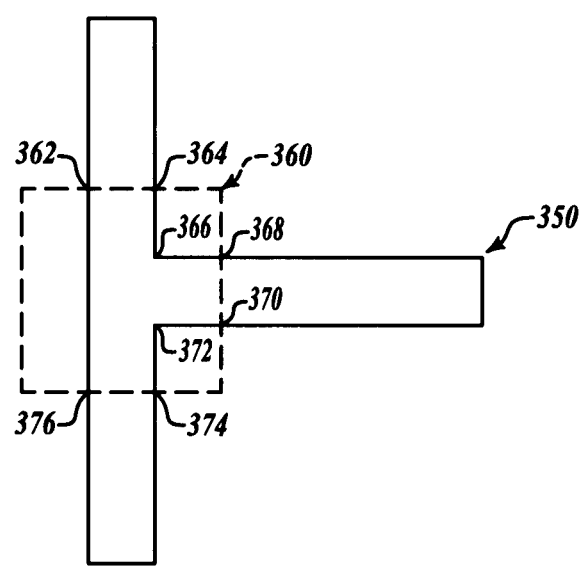
FIG. 10 illustrates another technique for detecting T-shaped features in accordance with the disclosed technology.

FIG. 10 illustrates an alternative technique for detecting T-shaped features. In this embodiment, the computer defines a boundary box 360 the intersection of two segments. For T-shapes the boundary box includes eight vertices 362-376. In contrast, L-shapes will only contain 6 vertices. By counting the vertices in the boundary box 360, the shape of the feature can be determined.

Figure 11:
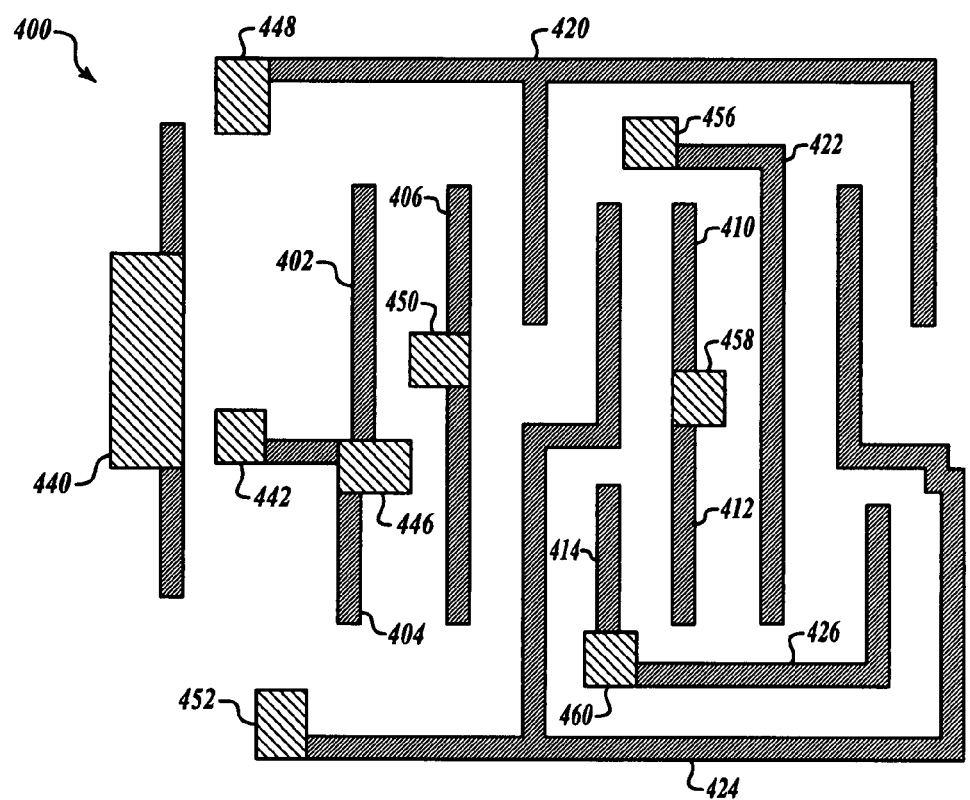
FIG. 11 illustrates a sample gate layout to be created with a double patterning process.

In the example target layout described above, the layout is representative of a metal layer in an integrated circuit. The disclosed technology can also be used on other layers such as the gate layer. FIG. 11 is an example of a portion of a gate layer that can be created with a double patterning technique. In this example, the target layout 400 has features of a more uniform size and width that are interspersed with larger landing pad features. In this example, the target layout includes a number of gate poly lines 402, 404, 406, 408, 410, 412, 414 and field poly lines 420, 422, 424 and 426. These lines are each connected to larger landing pad features such as landing pads 440, 442, 446 etc.

With a gate layer, one embodiment of the disclosed technology separates features the poly lines representing gates from the feature representing the larger landing pads. Upon receipt of the target layout or portion thereof, the target layout is analyzed to find those features having a width greater than some predefined value that identifies a feature as being a landing pad. Those features that are landing pads are divided from the poly line features in the target layout at the junction of the landing pads and the poly lines.

Figure 12:
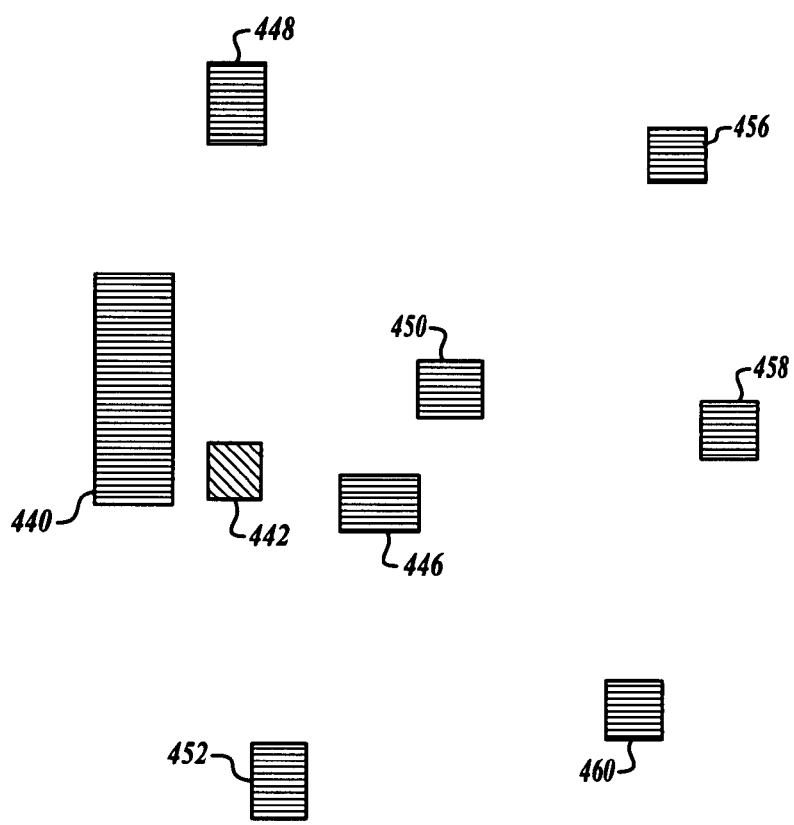
FIG. 12 illustrates landing pad features from the layout shown in FIG. 11.

In one embodiment, the landing pad features are separated into two mask layouts mask_0 and mask_1. A decomposition space is created by defining polygons between landing pad features that are closer than the resolution limit of the photolithographic system. Next, a coloring algorithm separates the features into one of the two mask layouts. FIG. 12 illustrates the landing pad features separated into two mask layouts. Landing pad features 440 and 446-460 are assigned to one mask layout while landing pad feature 442 is assigned to the other mask layout.

The same process is applied to the poly line features in order to separate the features into two mask layouts—mask_2 and mask_3. Next, the four mask layouts are combined back into two mask layouts in a way that will not produce layouts having features that are spaced closer than the resolution limit of the lithographic system.

Figure 13:
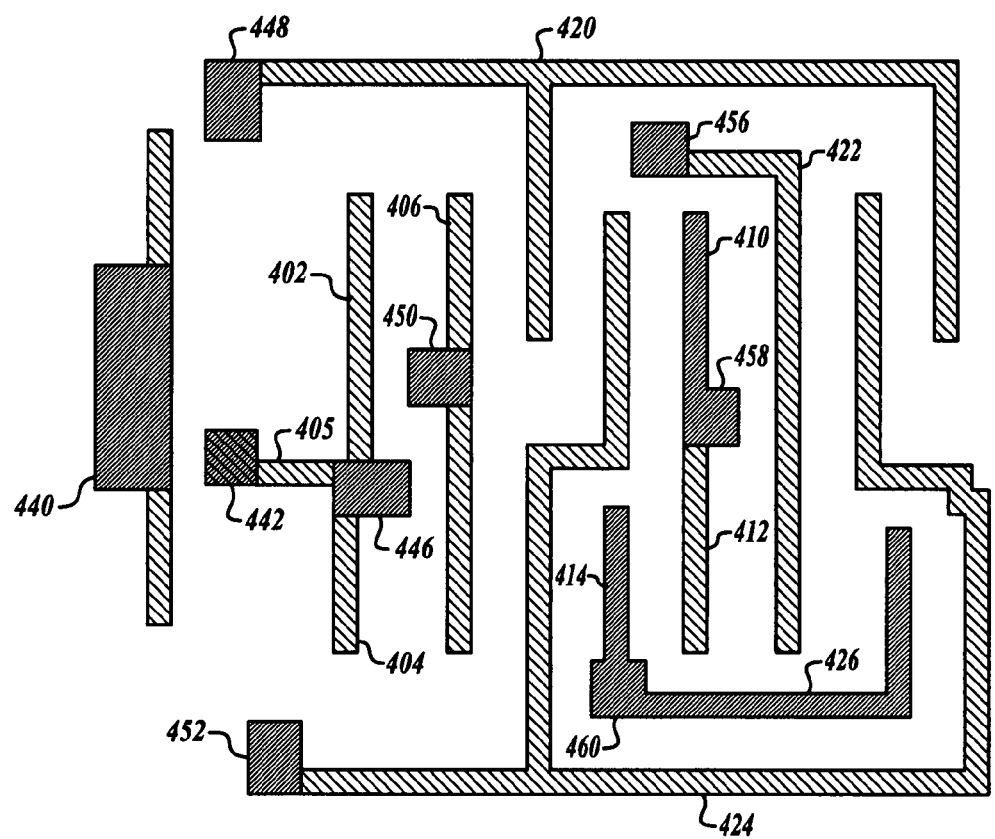
FIG. 13 illustrates a separation of features into a first and second mask layout.

FIG. 13 shows how the features can be recombined. Landing pad features 440, and 446-460 are assigned to one mask layout along with poly line features 410, 414 and 426. The remaining poly line features and landing pad feature 442 are included on the other mask layout.

Figure 14:
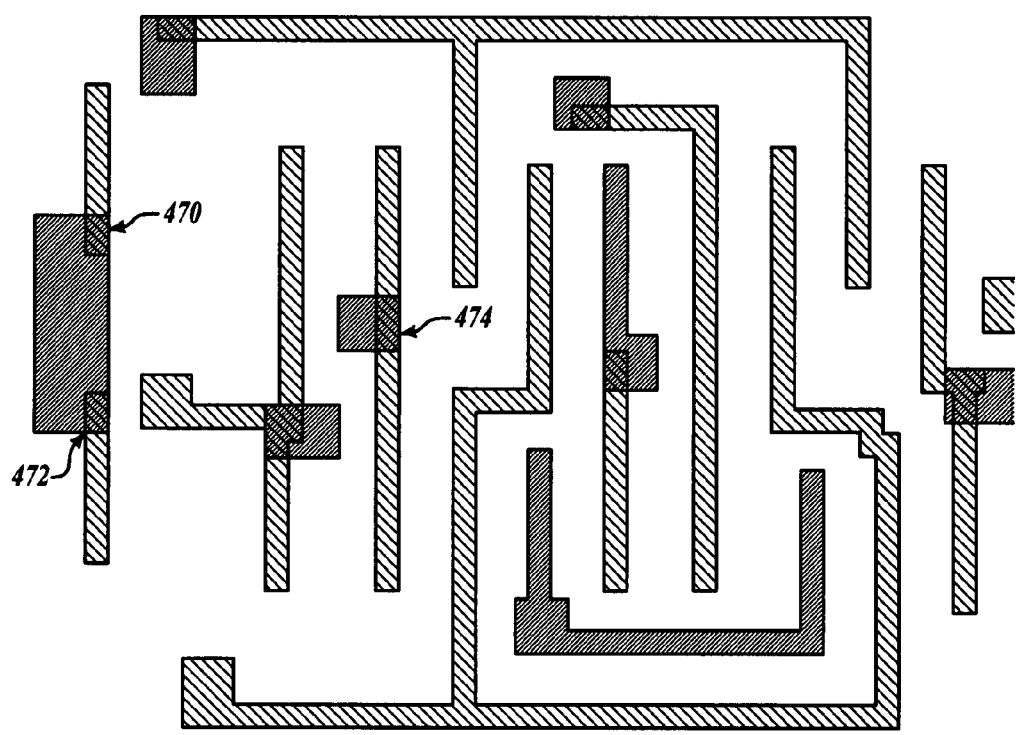
FIG. 14 illustrates biasing narrow poly lines into the landing pad features in accordance with another aspect of the disclosed technology.

The last step for processing gate layouts is to extend those portions of the poly line features that abut a landing pad feature for those positions where the features are defined in different mask layouts. In one embodiment, only the poly line features are biased into the area occupied by the landing pad feature as shown for example by areas 470, 472 and 474 in FIG. 14. This has the advantage of not introducing distortion into the landing pads by adding an extension to the features.

Figure 15:
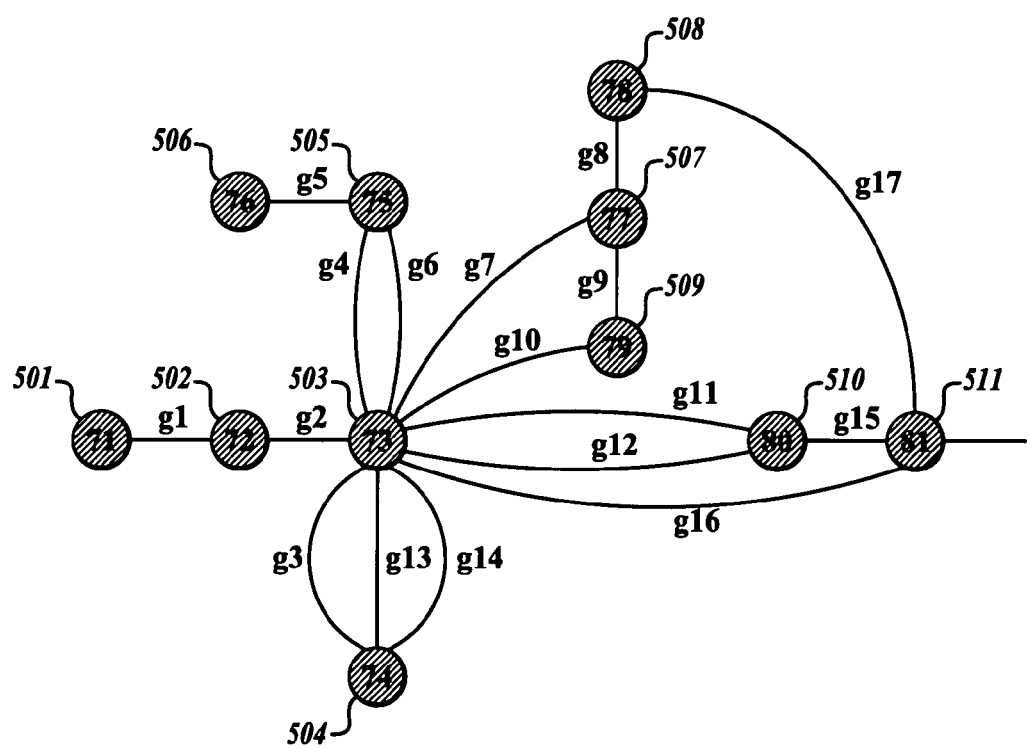
FIGS. 15 and 16 illustrate the operation of a coloring algorithm to separate features into two or more mask layouts.
Figure 16:
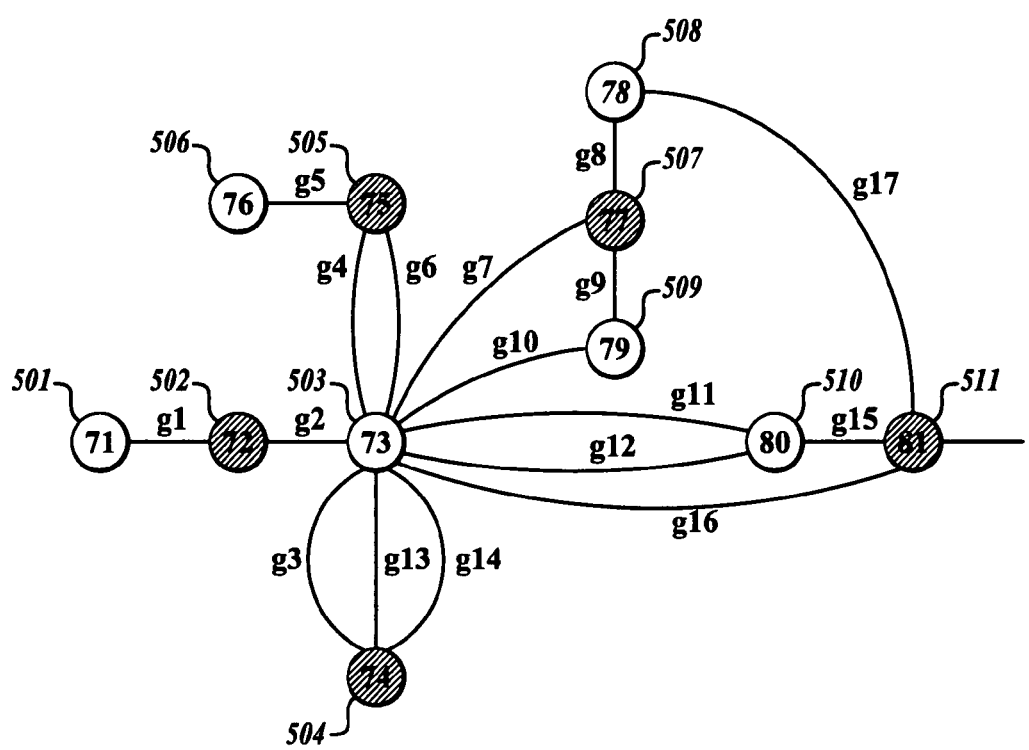

FIGS. 15-16 illustrate how the coloring algorithm in PSM-Gate assigns adjacent features in a sample layout pattern to different mask layouts.

First, each polygon that defines a feature to be parsed is assigned a unique identification number (e.g., 501, 502, 503, . . . n for n polygons—see FIG. 15). This can be only for a single cell defining one or more feature, or for many cells in a layout. Then, each connection between these polygons through features in the "decomposition space" layer is also assigned a unique identifier (e.g., g1, g2, g3, g4, . . . gm for m polygons).

These relationships are used to construct a graph, with the polygons 501 through n as nodes and the features of the decomposition space layer as the connections between the nodes. See FIG. 15. This graph is sometimes called a conflict graph.

A node in the graph is selected as the starting point. A "Depth-First Search" is then carried out, assigning the nodes to either group A or group B as the search progresses through the graph. A sequence of steps follows (as shown below), and a colored graph (indicated by plain or hashed nodes) is shown in FIG. 16.

Depth-first search coloring starting with Node 501.
Sequence moves generally from left to right through the layout, following each chain encountered to its end.
Assign Node 501 to layer A (Hashed)
Node 501 connected by g1 to Node 502; assign Node 502 to layer B (plain)
Node 502 connected by g2 to Node 503; assign Node 503 to layer A (hashed)
Node 503 connected by g4/g6 to Node 505: assign Node 505 to layer B (plain)
Node 505 connected by g5 to Node 506; assign Node 506 to layer B (plain).
End of chain. Back to Node 503.
Node 503 connected by g3/g13/g14 to Node 504; assign Node 504 to layer B (plain)
End of chain. Back to Node 503.
Node 503 connected by g7 to Node 507; assign Node 507 to layer B (plain)
Node 507 connected by g8 to Node 508; assign Node 508 to layer A (hashed)
Node 508 connected by g17 to Node 511; assign Node 511 to layer B 510 (plain)
Node 511 connected by g15 to Node 510; assign Node 510 to layer A (hashed)
The next step would be
Node 510 connected by g11/g12 to Node 503; assign Node 503 to layer B (plain)
but this is not possible because Node 503 is already assigned. Back to Node 507.
Node 507 connected by g9 to Node 509; assign Node 509 to layer A (hashed)
The next step would he
Node 509 connected by g10 to Node 503; assign Node 503 to layer B (plain)
but this is not possible because Node 503 is already assigned.
End of chain. Back to Node 511.
Node 511 connected to . . . (next polygon off illustrated graph).

Once a polygon has been assigned to either group A or B, it is not reassigned. Conflicts occur when a newly assigned polygon in another branch of the tree has a portion that connects to a polygon that is already assigned. When an assigned polygon is encountered, the algorithm currently does nothing, and instead moves on with the next node in the search. Such coloring conflicts are generally referred to as "phase conflicts" when the coloring algorithm is used to assign phase shift values to polygons. However, as used herein the term coloring conflict or decomposition conflict can encompass any two polygons that are assigned to the same group and are within a predetermined distance of each other.

Although the polygon assignment algorithm does not identify these conflicts as they are created, they are easily detected after the assignment is finished by using a DRC check for minimum spacing among the polygons assigned to collection group A or collection group B.

Note also that there need not be a single layer of features in the decomposition space. The features can actually be on multiple data layers as well, some assigned a higher priority than others (indicated by the data layer used to store them). Coloring can first be done using a graph constructed using only the high priority "features," then re-colored using all the features.

From the initial assignment of features into two different groups or data layers, a determination can be made if features in each group or data layer have the minimum separation required for printing with a single mask. Features that are too close can be readily identified by software programs which determine the distance between adjacent features. If the distance is less than or equal to some predetermined amount and the features are assigned to the same group or data layer, a user can be alerted to the fact that a decomposition conflict exists.

It should be noted that, although the examples used to illustrate this disclosed technology have been related to double patterning, these data parsing techniques could be similarly used for triple patterning or, in some cases, for double or multiple exposure processes. Likewise, although these may have been illustrated with layouts which appear to be bright field (i.e. features of dark polygons on an otherwise clear background), these techniques could be used with either bright field or dark field layouts, as long as the separation and feature cutting rules suitably accommodate the actual process and structures that are to be used.

Although both double patterning and double exposure require parsing layout data, and use two photomasks and two exposures, the specific rules about separating data to the two masks can be significantly different and process specific, and the process data for one approach often cannot be exchanged for another. However, although a particular data parsing technique may be developed for a double patterning process, it is conceivable that the same technique for data parsing could apply to some subsequent double exposure process with special characteristics, or vice versa.

In view of the many possible embodiments to which the principles of the disclosed technology may be applied, it should be recognized that the illustrated embodiments are only preferred examples of the disclosed technology and should not be taken as limiting the scope of the disclosed technology. Rather, the scope of the disclosed technology is defined by the following claims and equivalents thereof.

We claim:

1. A method of preparing layout data with a computer to create two or more mask layouts that produce a target pattern of features during a photolithographic process manufacturing process, comprising:

receiving a target layout or a portion of the target layout into a memory device that defines features to be created with the photolithographic process;

employing a computer to search the features in the target layout received in the memory device for features having a predefined shape;

isolating a portion of one or more of the features that have a predefined shape; and supplying features in the target layout without the isolated portion to a coloring algorithm that assigns features of the target layout to a first mask layout or a second mask layout.

2. The method of claim 1, further comprising: receiving a first layout and a second layout of features that have been assigned by the coloring algorithm and exporting the first layout and the second layout to a mask writing tool.

3. The method of claim 1, further comprising:

receiving into the memory device a layout pattern that defines a number of features to be created with the photolithographic process;

analyzing the features in the layout pattern to determine features having a size between a minimum size and a maximum size; and selecting the features of the layout pattern having a size between the minimum size and the maximum size as the features of the target layout.

4. The method of claim 3, further comprising: selecting features of the layout pattern having a size outside of the minimum or maximum size as a remainder layout.

5. The method of claim 4, further comprising:

receiving a first layout and a second layout that have been assigned by the coloring algorithm and adding the features of the remainder layout to either of the first layout or the second layout.

6. The method of claim 5, further comprising:

determining if the addition of features in the remainder layout would violate a mask constraint and adding the features to either of the first layout or the second layout such that the addition does not violate a mask constraint.

7. The method of claim 1, wherein the target layout is searched for features having a U-shape.

8. The method of claim 1, wherein the target layout is searched for features having an S-shape.

9. The method of claim 1, wherein the target layout is searched for features having a T-shape.

10. The method of claim 7, further comprising: isolating a middle portion of a U-shaped feature by adding a cut point at a predefined position in the U-shaped feature.

11. The method of claim 8, further comprising: isolating a middle portion of an S-shaped feature by adding a cut point at a predefined position of the S-shaped feature.

12. The method of claim 9, further comprising: isolating a portion of a T-shaped feature by adding a cut point at a predefined position of the T-shaped feature.

13. The method of claim 1, further comprising adding the isolated portions of the features to the features in the first mask or the second mask layouts.

14. The method of claim 13, further comprising:

determining where features in the first and second mask abut in the target layout and extending at least one of the abutting features to overlap the other in the area of the abutment.

15. The method of claim 13, further comprising:

determining if the abutting features are substantially the same size, and if so, extending both abutting features to overlap the other in the area of the abutment.

16. The method of claim 13, further comprising: determining if one of the abutting features is larger than the other abutting feature, and if so, extending a smaller abutting feature to extend into an area of a larger abutting feature.

17. A computer storage device including a number of instructions that are executable by a computer to perform any of method claims 1-16.

18. A computer storage device including a first mask layout and a second mask layout that are used to produce a pattern of features on a wafer with a photolithographic process that is produced by any of claims 1-16.

19. A computer system that executes a sequence of instructions to perform any of the method claims 1-15.

\* \* \* \* \*